July 2, 1963 M. S. AXELROD ETAL 3,096,450
MATCHED NEGATIVE RESISTANCE PAIR HAVING CRITICAL INDUCTANCE
IN SERIES EFFECTING SLIGHT INSTABILITY
Filed Dec. 28, 1961

INVENTORS
MARTIN S. AXELROD
DONALD E. ROSENHEIM
BY Stephen J. Limanek
ATTORNEY

United States Patent Office 3,096,450

Patented July 2, 1963

3,096,450

MATCHED NEGATIVE RESISTANCE PAIR HAVING CRITICAL INDUCTANCE IN SERIES EFFECTING SLIGHT INSTABILITY

Martin S. Axelrod, North White Plains, and Donald E. Rosenheim, Yorktown Heights, N.Y., assignors to International Business Machines Corporation, New York, N.Y., a corporation of New York Filed Dec. 28, 1961, Ser. No. 162,672
7 Claims. (Cl. 307—88.5)

This invention relates to logic circuits and more particularly to synchronous tunnel diode logic circuits.

Since the discovery of the tunnel diode by L. Esaki in 1958 as described in Physical Review, volume 109, pages 603–604, January 15, 1958, "New Phenomenon in Narrow Germanium p-n Junctions," many circuits have been designed in the digital computer field which have attempted to capitalize on the inherent advantages of this relatively new device for both memory and logic applications. The inherent advantages of the tunnel or Esaki diode are high speed, low power dissipation, device simplicity, small size and high stability with changes in environmental conditions such as temperature and nuclear radiation.

Several tunnel diode logic circuits have been reported in the literature, for example, R. H. Bergman, "Tunnel Diode Logic Circuits," IRE Transactions on Electronic Computers, volume EC–9, pages 430–438, December 1960; W. F. Chow, "Tunnel Diode Logic Circuits," Electronics, pages 103–107, June 24, 1960 and E. Goto et al., "Esaki Diode High-Speed Logical Circuits," IRE Transactions on Electronic Computers, volume EC–9, pages 25–29, March 1960. These prior art circuits include single diode monostable circuits, single diode bistable circuits and a serially connected pair of diodes known as the Goto-pair circuit. Although these prior art circuits have been found to operate successfully, each of them has certain limitations when used in high speed computing systems. In both the single diode monostable and single diode bistable circuits, when a logic signal is applied thereto the load line is shifted beyond the current peak of the well-known current voltage characteristic curve of the tunnel diode. The gain of these circuits is, therefore, directly related to how close to the peak voltage the diode is biased. This necessitates the maintenance of strict tolerances on the diode characteristics and on the bias supply of the circuit. In the Goto-pair circuit the maximum output current which may be realized is equal to the difference between the peak and valley currents of the current-voltage characteristic curve of the tunnel diode. To approach this output current it is necessary to use well-matched diodes and to maintain a tight tolerance on the alternating current supply voltage which swings one diode onto its high voltage stable state.

It is, therefore, an object of this invention to provide an improved logic circuit using tunnel or Esaki diodes.

Another object of this invention is to provide an improved high speed current pulse amplifier.

Still another object of this invention is to provide an improved synchronous high speed current pulse amplifier.

Yet another object of this invention is to provide an improved logic circuit having a pair of tunnel diodes capable of delivering an output current greater than the peak current of one of the pair of diodes used in the circuit.

A further object of this invention is to provide an improved logic circuit having a greater number of fan-in plus fan-out circuits than that of prior art tunnel diode circuits.

Still a further object of this invention is to provide an improved tunnel diode circuit which has greatly relaxed tolerance requirements on the amplitude of the supply voltage than that of prior art tunnel diode circuits.

Yet a further object of this invention is to provide an improved twin tunnel diode circuit wherein an alternating current power supply voltage is used solely to lock the output frequency thereof to the power supply frequency.

A still further object of this invention is to provide an improved tunnel diode circuit wherein the operation of the diode is restricted to the tunneling region, i.e., the majority carrier conduction, of the diode rather than in the slower higher junction capacity diffusion region, i.e., the minority carrier conduction.

In accordance with the present invention there is provided a logic circuit which comprises a series combination including a pair of matched tunnel diodes, a pair of inductors and a push-pull power supply having a direct current source and alternating current source connected across the series combination of the diodes and inductors. The inductors of the circuit have a value such that the total series inductance of the circuit is greater than the total series resistance, times the negative resistance of one of the circuit diodes times the capacitance of one of the circuit diodes in the high voltage state plus stray capacitance, such that the stability criterion for the circuit is not satisfied.

An important advantage of the circuit of the present invention is that a larger output current is produced than has been produced in prior art tunnel diode circuits.

An improtant feature of this invention is that the high current output is produced by the circuit of this invention by properly biasing the circuit and providing an inductance therein of at least a given magnitude.

The foregoing and other objects, features and advantages of the invention will be apparent from the following more particular description of a preferred embodiment of the invention, as illustrated in the accompanying drawing.

Figure 1:
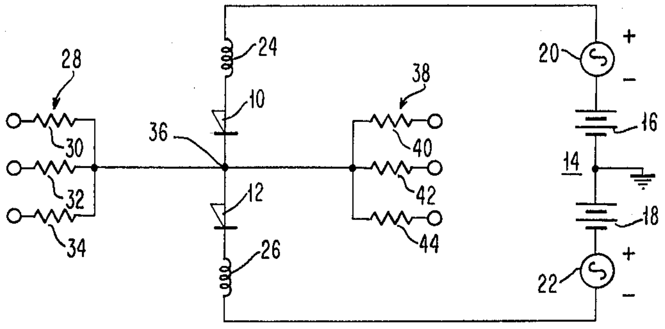
FIG. 1 illustrates the circuit of the present invention.

Referring to the drawing in more detail, there is shown in FIG. 1 a first tunnel or Esaki diode 10 connected serially to a second tunnel or Esaki diode 12, the negative terminal of the first diode 10 being connected to the positive terminal of the second diode 12. A low impedance push-pull power supply 14 includes first and second direct current sources 16 and 18 and first and second alternating current sources 20 and 22, the negative terminal of the first direct current source 16 being connected to a point of ground potential and the positive terminal of the second direct current source 18 also being connected to the point of ground potential. The first alternating current source 20 is connected serially with the first direct current source 16 and the second alternating current source 22 is connected serially with the second direct current source 18 so that the first alternating current source 20 produces a positive voltage with respect to the point of ground potential when the second alternating current source is producing a negative voltage with respect to the point of ground potential, as indicated in FIG. 1 of the drawing. A first inductor 24 is disposed between the first diode 10 and the first alternating current source 20 of the power supply 14 and a second inductor 26 is disposed between the second diode 12 and the second alternating current source 22 of the power supply 14. An input circuit 28 in a fan-in arrangement including first, second and third resistors 30, 32 and 34 is connected to a common point 36 between the first and second diodes 10 and 12. An output circuit 38 in a fan-out arrangement having first, second and third resistors 40, 42 and 44 is also connected to the common point 36 between the first and second diodes 10 and 12.

The first and second diodes 10 and 12 should be matched tunnel diodes, that is, each of these diodes should have a current-voltage characteristic which is similar to that of the other diode. The value of each of the first and second inductors 24 and 26 should be equal to the value of the other and, furthermore, it should be such that $L_s > R_s R_n C$, where $L_s$ is the total series inductance of the circuit, $R_s$ is the total series resistance, including the resistance of one of the first and second diodes 10 and 12 when it is in its low voltage state, $R_n$ is the negative resistance of one of the first and second diodes 10 and 12 and C is the capacitance of a diode plus any stray capacitance. This relatively high inductance value is in contrast with the above mentioned Goto-pair circuit which operates only with little or no inductance.

Figure 2:
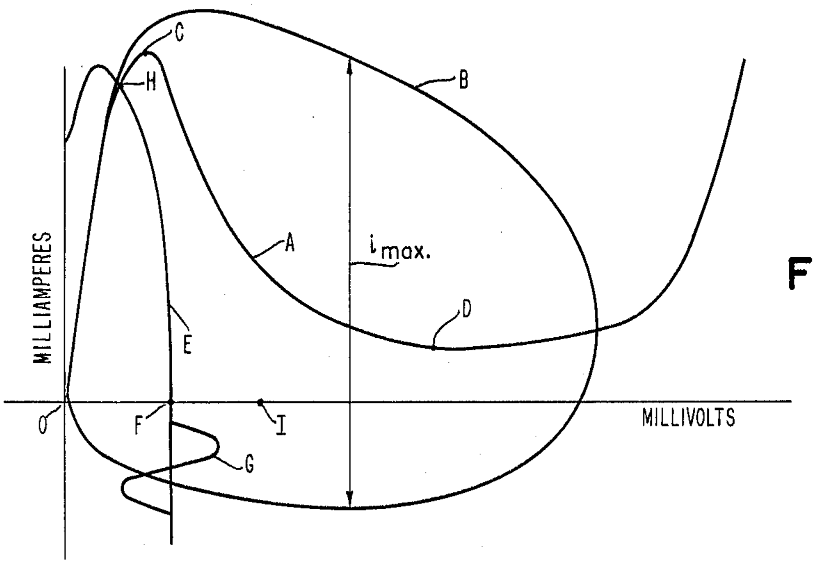
FIG. 2 is a graph indicating current and voltage relationships in the circuit shown in FIG. 1.
Figure 3:
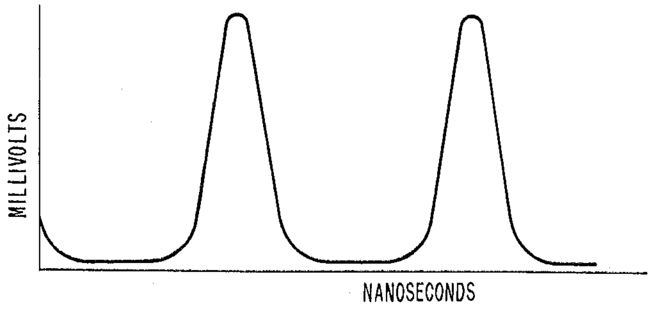
FIG. 3 is a graph showing the output voltage of the circuit of FIG. 1 plotted against time.

FIG. 2 of the drawing indicates current-voltage relationships at various locations of the circuit illustrated in FIG. 1. Curve A of FIG. 2 shows the voltage-current characteristic of either diode of the first and second diodes 10 and 12 shown in FIG. 1 of the drawing and curve B shows the excursion of the operating point, i.e., the relationship of the current through and the voltage across the diode that switches, as an output pulse, indicated in FIG. 3 of the drawing, is generated. The voltage-current characteristic curve A has three principal regions, the low-voltage positive resistance region between point O and C, the peak current of each of the diodes, the negative resistance region between point C and point D and the high-voltage positive resistance region lying beyond point D. Curve E indicates the load line of the circuit as seen from the terminals of the diode having the characteristic curve A. The direct current bias indicated at point F represents the total direct current voltage across the first and second direct current sources 16 and 18 and the sinusoidal wave G indicates the voltage difference produced between the first and second alternating current sources 20 and 22 applied to the series combination including the first and second diodes 10 and 12 and the first and second inductors 24 and 26. The alternating current voltage indicated by curve G is superimposed on the direct current voltage having the magnitude indicated by point F. The maximum output current value is indicated by the line $i_{max}$.

In the operation of the circuit illustrated in FIG. 1 of the drawing the direct current voltage from the power supply 14 establishes a stable operating state at point H which is the common point on curves A and E in FIG. 2 of the drawing by biasing the first and second diodes such that each diode is in its low-voltage positive-resistance region. The alternating current component G of the power supply 14 has a voltage amplitude large enough to carry one of the diodes only into its negative resistance region. Thus, the tolerance requirement on the amplitude of the alternating current component is greatly relaxed for this circuit since it is only necessary to carry one diode somewhere into its negative resistance region. The amplitude of this alternating current component is small compared with the amplitude of the alternating current voltage necessary for the operation of the Goto-pair circuit. The other diode then remains in the low voltage positive resistance region. The polarity of a small input signal from the input circuit 28 to the common point 36 between the first and second diodes 10 and 12 determines which of these two diodes goes into the negative resistance region and hence determines the polarity of the output pulses in the output circuit 38. If a negative input signal is applied to the common point 36 a negative output pulse is produced in the output circuit 38 and if a positive input signal is applied to the common point 36 a positive output pulse is produced in the output circuit 38. Since the series inductance $L_s$ of the circuit is such that $L_s > R_s R_n C$, the negative resistance region is unstable. When one of the two diodes 10 and 12 is carried into the negative resistance region the circuit oscillates. The period of oscillation and the path of the operating point indicated by curve B of FIG. 2 is determined by the circuit parameters and, therefore, for a particular pair of matched diodes the inductance is used to determine the path of the operating point of the switching diode and the frequency of operation of the circuit. Thus, if desired, the shape of curve B may be such that it remains within the vicinity of the low voltage positive resistance region and the negative resistance region, which is the tunneling region of the diode. The period of the alternating current component of the power supply 14 should be such that when the operating point has traversed its path once the alternating current voltage has re-established the diodes 10 and 12 in their low-voltage positive resistance regions. This insures the output of a single pulse for each cycle of the power supply frequency produced by the alternating current sources 20 and 22.

If the direct current bias across the series combination is increased to a value which may be, for example, that indicated by point I in FIG. 2 of the drawing, the load curve E passes through the point I, rather than through point F, so that one diode is in its negative resistance region, the load curve E now passing through the negative resistance region of curve A, and the other diode is in its low voltage region. With a direct current voltage bias equal to that represented by point I of FIG. 2 the circuit runs freely, thus, without the need for an alternating current component from the power supply 14, at a frequency and with a pulse width determined by the circuit and diode parameters. With an alternating current voltage component produced by the power supply 14 the alternating current voltage is used merely as a synchronizing signal to lock the frequency of the output of the free running circuit to the alternating current power supply frequency. The path of the operating point is similar to that shown by curve B of FIG. 2 and the decision as to which of the two diodes 10 and 12 goes into its negative resistance region is made by the polarity of the input signal arriving at the common point 36 between the first and second diodes 10 and 12 when both of the diodes are in their low-voltage regions just prior to the switching of one of the diodes 10, 12. It should be understood that when the alternating current voltage is used merely as a synchronizing signal in this circuit, the circuit and diode parameters may be adjusted so that two or more output pulses are produced for each cycle of the alternating current power supply voltage.

In the circuit of the present invention a matched pair of five milliampere germanium tunnel diodes biased in their low-voltage region and a 125 megacycle sine wave produced by the first and second alternating current sources 20 and 22 to carry one of the diodes into its negative resistance region may be used. The capacity of each of the diodes which includes stray or package capacity is equal to five micro-microfarads and the inductance of each of the inductors 24 and 26, including the lead inductance of the package, is equal to 20 millimicrohenries. The resistance of one of the resistors 30, 32 and 34 of the input circuit may be equal to 200 ohms and the load resistance corresponding to a fan-in plus fan-out of nine equal to 25 ohms. A low impedance power supply should be used. The voltage produced by each of the alternating current voltage sources 20 and 22 may be equal to $.05+.02 \sin (2\pi)(125\times 10^6)t$ volts and the input voltage applied by the input circuit to the common point 36 equal to 0.1 volt. With the values of the elements of the circuit as mentioned hereinabove the current supplied to the load, as an output pulse is generated, is approximately 5.5 milliamperes, a value greater than the peak current value of either of the diodes 10 and 12, at a repetition rate of 125 million pulses per second.

It should be understood that the circuit of this invention readily performs majority logic, i.e., the polarity of the output pulse in the output circuit 38 is the same as the polarity of the majority of the pulses in the input circuit 28 of FIG. 1. When majority logic is being performed by this circuit the input circuit 28 should have a fan-in equal to an odd number. The circuit of this invention can also perform AND or OR functions by applying a negative or positive direct current voltage to one of the resistors 30, 32, 34 of the input circuit 28. When it is desired to direct the flow of information in a system utilizing the circuits of the present invention a multiphase power supply of the type suggested by J. VonNeumann in U.S. Patent No. 2,815,488 granted on December 3, 1957 may be used.

Accordingly, it can be seen that an improved logic circuit, which may be considered as a balanced inductor logical element, has been provided which supplies load current having a magnitude greater than the magnitude of the peak current value of one of the tunnel diodes used in the circuit and which has less severe tolerance requirements than do prior art tunnel diode circuits.

While the invention has been particularly shown and described with reference to a preferred embodiment thereof, it will be understood by those skilled in the art that various changes in form and details may be made therein without departing from the spirit and scope of the invention.

What is claimed is:

1. A logic circuit comprising:
(*a*) a pair of tunnel diodes,
(*b*) a source of electrical energy,
(*c*) a pair of inductors and
(*d*) means for interconnecting said diodes, said energy source and said inductors,
(*e*) said inductors having values such that the total series inductance of the circuit is greater than the total series resistance times the negative resistance of one of said pair of diodes times the capacitance of said one diode.

2. A logic circuit comprising:
(*a*) a pair of interconnected tunnel diodes,
(*b*) a source of electrical energy and
(*c*) a pair of inductors each interconnecting one of said diodes and said energy source, said inductors having values such that $L_s > R_s R_n C$, where $L_s$ is equal to the total series inductance of the circuit, $R_s$ is the total series resistance, $R_n$ is the negative resistance of one of said pair of diodes and C is the capacitance of said one diode.

3. A logic circuit comprising:
(*a*) a pair of tunnel diodes, each having a negative and a positive terminal, a negative terminal of one of said diodes being connected to a positive terminal of the other of said diodes,
(*b*) a source of electrical energy having a pair of terminals and
(*c*) a pair of inductors, one of said inductors interconnecting said one diode and one terminal of the pair of terminals of said energy source and the other of said inductors interconnecting said other diode and the other terminal of the pair of terminals of said energy source, said inductors having inductance values such that $L_s > R_s R_n C$, where $L_s$ is the total series inductance of the circuit, $R_s$ is the total series resistance, $R_n$ is the negative resistance of one of said pair of diodes and C is the capacitance of said one diode and stray capacitance.

4. A logic circuit as set forth in claim 3 wherein said energy source includes
(*a*) means for producing a direct current component of electrical energy and
(*b*) means for producing an alternating current component of electrical energy.

5. A logic circuit comprising:
(*a*) first and second matched tunnel diodes, each having a negative and a positive terminal, the negative terminal of said first diode being connected to the positive terminal of said second diode,
(*b*) a source of electrical energy having a pair of terminals and including means for producing direct current and alternating current components of electrical energy and
(*c*) first and second inductors, said first inductor interconnecting the positive terminal of said first diode and one terminal of said energy source and said second inductor interconnecting the negative terminal of said second diode and the other terminal of said energy source, said inductors having similar inductance values such that $L_s > R_s R_n C$, where $L_s$ is the total series inductance of the circuit, $R_s$ is the total series resistance, $R_n$ is the negative resistance of one of said diodes and C is the capacitance of said one diode and stray capacitance.

6. A logic circuit comprising:
(*a*) first and second tunnel diodes having similar current-voltage characteristics and each having a negative terminal and a positive terminal, the negative terminal of said first diode being connected to the positive terminal of said second diode providing a common point therebetween,
(*b*) a push-pull power supply having a positive terminal and a negative terminal and including first and second direct current sources and first and second alternating current sources, said first direct current source being connected between the positive terminal of said power supply and a point of ground potential through said first alternating current source and said second direct current source being connected between the negative terminal of said power supply and the point of ground potential through said second alternating current source, said first alternating current source providing a positive voltage at the positive terminal of said power supply with respect to the point of ground potential when said second alternating current source provides a negative voltage at the negative terminal of said power supply with respect to the point of ground potential, and
(*c*) first and second inductors, said first inductor interconnecting the positive terminal of said first diode and the positive terminal of said power supply and said second inductor interconnecting the negative terminal of said second diode and the negative terminal of said power supply, said inductors having similar inductance values such that $L_s > R_s R_n C$, where $L_s$ is the total series inductance of the circuit, $R_s$ is the total series resistance, $R_n$ is the negative resistance of one of said diodes and C is the capacitance of said one diode and stray capacitance.

7. A logic circuit as set forth in claim 6 further including means for applying an input signal to and for deriving an output signal from the common point between said first and second diodes.

No references cited.